March 12, 1963

E. G. ROKA 3,081,421

UNIPOLAR TRANSISTOR

Filed Aug. 17, 1954

INVENTOR
Edward G. Roka
BY R. E. Fowler
ATTORNEY

United States Patent Office 3,081,421

Patented Mar. 12, 1963

3,081,421
UNIPOLAR TRANSISTOR

Edward G. Roka, Kokomo, Ind., assignor to General Motors Corporation, Detroit, Mich., a corporation of Delaware Filed Aug. 17, 1954, Ser. No. 450,427
5 Claims. (Cl. 317—234)

This invention relates to semi-conductors or transistors and more particularly to the unipolar or analogue type of transistor.

Although the junction and point contact type of transistors are those mostly commonly referred to and used, there is a further type known as the unipolar or analogue type which is proving very useful. This type is referred to as the analogue type because its action is more nearly analogous to that of a vacuum tube. In unipolar transistors a crystal formed of a p-type section and an n-type section is used with a potential applied across the crystal to cause current flow therethrough. This flow through the crystal may be controlled by applying a junction across or around the crystal termed a gate junction and supplying a control voltage to the junction. The similarity to vacuum tube operation is evident.

However, difficulties have been encountered in securing proper closed junction ring construction on the unipolar type which is necessary to avoid instability and drift of the transistor.

It is therefore an object in making this invention to provide a unipolar transistor of new design which is very stable.

It is a further object in making this invention to provide a unipolar transistor in which the junction rings are applied to flat side surfaces of the crystal.

It is a further object in making this invention to provide circular junction rings applied to the sides of a crystal to control the flow through the same.

With these and other objects in view which will become apparent as the specification proceeds, my invention will be best understood by reference to the following specification and claims and the illustrations in the accompanying drawings, in which:

Figure 1:
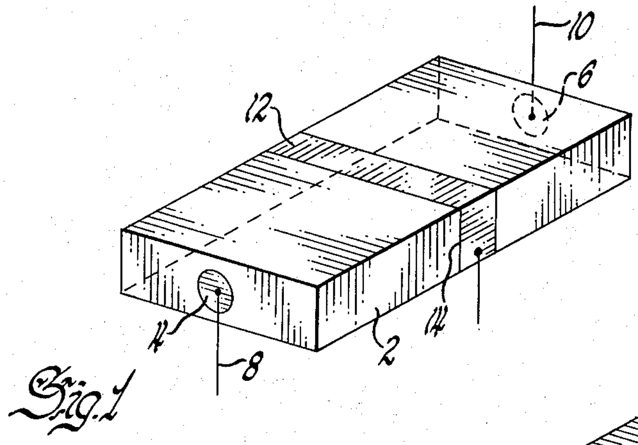
FIGURE 1 is a perspective view of a unipolar transistor of the conventional type.

The unipolar transistor as illustrated in FIGURE 1 consists of a crystal 2 of semi-conductive material, such for example as germanium, which has one area or region having p-type characteristics, and another area joined thereto having n-type characteristics. The application of voltage across the crystal causes a flow of current therethrough.

Ohmic contacts 4 and 6, which may be of zinc, antimony or others on n-type silicon or germanium, are alloyed or otherwise suitably secured to the opposite ends of the crystal. Lead wires 8 and 10 may be attached to the contacts. A junction band 12, which may for example be of aluminum, is alloyed around the central portion of the crystal 2. This junction band performs the function of a grid in a vacuum tube by affecting the flow of current through the crystal dependent upon the potential on said ring. In order for the ring to function properly and the transistor to be stable in its operation, the sides of the ring at 14 have to be alloyed to said crystal and the corners of sufficient depth to form a continuous conductive ring around the crystal and adhered properly thereto throughout its length. This has proven difficult to attain.

Figure 2:
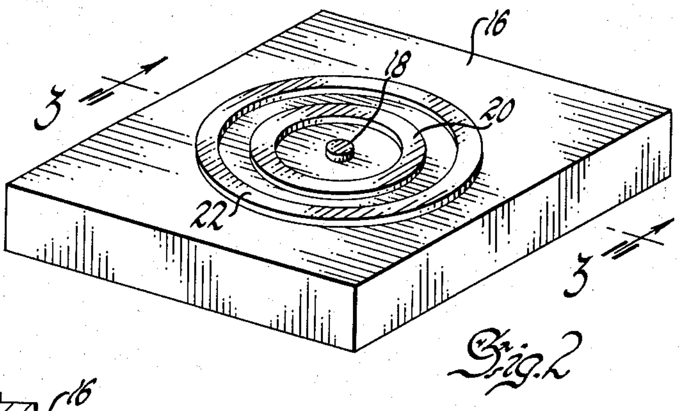
FIGURE 2 is a perspective view of a unipolar transistor embodying my invention.
Figure 3:
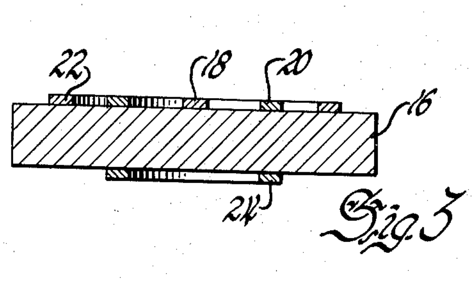
FIGURE 3 is a sectional view taken on the line 3—3 of FIGURE 2.

I have therefore devised a new form of unipolar transistor as shown in FIGURES 2 and 3. In this form the the semi-conductive crystal 16 has alloyed to one face thereof three separated areas of conductive material. The inner area 18 is circular and concentrically surrounding this are two radially spaced circular rings 20 and 22. The surrounding conductive areas may of course be of any other shape as long as they enclose the inner areas. The central area 18 and the outermost ring 22 provide ohmic contact areas and may be formed of, for example, zinc cobalt or other similar material, and the intermediate one 20, the junction ring, may be formed of aluminum. On the opposite face of the crystal 16 and in alignment therewith is a second alloyed junction ring 24 formed of the same material. It will be obvious that any current flow through the crystal from ohmic contact area 18 to area 22 must flow between rings 20 and 24 and therefore the potential on these rings will control such flow.

Figure 4:
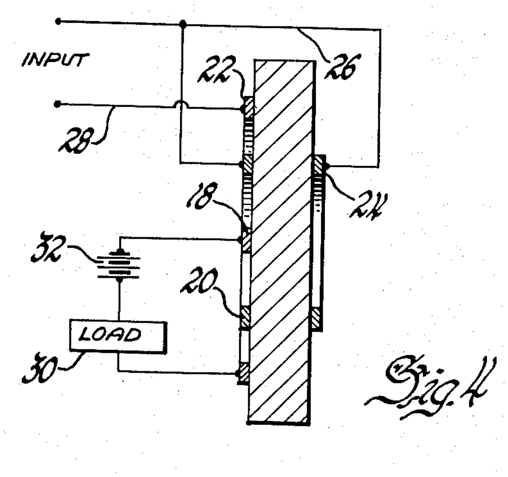
FIGURE 4 is a circuit diagram illustrating the connection of the transistor into a circuit.

The connections of circuits to said crystal are shown in FIGURE 4. Line 26 is commonly connected to junction rings 20 and 24. Line 28 is directly connected to ohmic ring 22. The input circuit is connected across lines 26 and 28. The load circuit 30 and a source of power indicated as a battery 32 are connected across ohmic contacts 18 and 22. In this design the areas 18, 20, 22 and 24 are all flat areas on a relatively large surface that alloy well and form a good bond with no sharp corner sections. The flow of current through the crystal from area 18 to area 22 all flows between rings 20 and 24 and is controlled by the potential on said rings.

This construction may also be used as a junction type transistor instead of a unipolar type by connecting the contacts differently. The intermediate contact on one side may be connected to act as the emitter electrode and the similar contact on the reverse side as the collector electrode. Any other contact or contacts may be used as the base contacts in a junction type operation.

I claim:

1. A unipolar transistor comprising a flat semi-conductor crystal, an area of conductive material alloyed to one flat surface to form an ohmic contact therewith, a first ring of conductive material alloyed to said flat surface spaced from said first area and surrounding the same forming a junction contact therewith, a second ring of conductive material alloyed to the surface forming an ohmic contact therewith and spaced from the first and concentric therewith and a ring of conductive material alloyed to the opposite face of the crystal forming a junction contact and substantially in alignment with the first-named ring on the first-named face.

2. A unipolar transistor comprising a crystal formed of semiconductor material having flat side surfaces, an area of cobalt alloyed to one face of the crystal, a ring of aluminum alloyed to the crystal surrounding the first-named area and spaced therefrom, a second ring formed of cobalt alloyed to the surface spaced from and surrounding said first ring and a ring formed of aluminum alloyed to the opposite face substantially in alignment with the first ring, said aluminum rings forming the junction contacts for control.

3. A unipolar transistor comprising a crystal formed of semi-conductor material having flat side surfaces, an area of ohmic contact placed on one face of the crystal, a junction ring placed on the crystal surrounding the first-named area and spaced therefrom, a second ring of ohmic contact placed on the surface spaced from and surrounding said first ring and a junction ring placed on the opposite face substantially inalignment with the first ring, said junction rings forming the junction contacts for control.

4. A signal translating device comprising a body of semi-conductor material, a central ohmic contact zone and an annular ohmic contact zone circumscribing said central zone on one face of said body, said body being of one conductivity type and having on said one face an annular region of the opposite conductivity type interposed between said zones, and an annular region of said opposite conductivity type disposed on the opposite face of said body in alignment with the first mentioned region.

5. A signal translating device comprising a body of semi-conductor material, a central ohmic contact zone and an annular ohmic contact zone circumscribing said central zone on one face of the body, said contact zones being adapted for connection with an external load circuit whereby an internal load circuit is defined between said contact zones through said body, said body having a rectifying junction contact of annular configuration disposed between said contact zones on said one face, and a rectifying junction contact of annular configuration disposed oppositely of the first mentioned rectifying junction contact on the opposite face of said body, said junction contacts being adapted for connection with an external control circuit whereby an electric field may be established transversely of the internal load circuit for control of current flow therein.

References Cited in the file of this patent

UNITED STATES PATENTS

| | | |
|---|---|---|
| 2,600,500 | Haynes et al. | June 17, 1952 |
| 2,644,914 | Kircher | July 7, 1953 |
| 2,666,814 | Shockley | Jan. 19, 1954 |
| 2,672,528 | Shockley | Mar. 16, 1954 |
| 2,709,232 | Thedieck | May 24, 1955 |
| 2,754,431 | Johnson | July 10, 1956 |
| 2,953,730 | Pantchechnikoff | Sept. 20, 1960 |
| 2,999,195 | Saby | Sept. 5, 1961 |